US012700686B2

(12) United States Patent
Gardner

(10) Patent No.: US 12,700,686 B2
(45) Date of Patent: Aug. 4, 2026

(54) CONNECTOR ASSEMBLY FOR SENSOR DEVICE

(71) Applicant: Analog Devices, Inc., Wilmington, MA (US)

(72) Inventor: Michael J. Gardner, Lynnfield, MA (US)

(73) Assignee: Analog Devices, Inc., Wilmington, MA (US)

( * ) Notice: Subject to any disclaimer, the term of this patent is extended or adjusted under 35 U.S.C. 154(b) by 552 days.

(21) Appl. No.: 18/006,452

(22) PCT Filed: Jul. 30, 2021

(86) PCT No.: PCT/US2021/044009
§ 371 (c)(1),
(2) Date: Jan. 23, 2023

(87) PCT Pub. No.: WO2022/026895
PCT Pub. Date: Feb. 3, 2022

(65) Prior Publication Data
US 2023/0352862 A1 Nov. 2, 2023

Related U.S. Application Data

(60) Provisional application No. 63/059,875, filed on Jul. 31, 2020.

(51) Int. Cl.
*H01R 12/70* (2011.01)
*H01R 12/71* (2011.01)
(Continued)

(52) U.S. Cl.
CPC ....... *H01R 12/7076* (2013.01); *H01R 12/712* (2013.01); *H01R 12/722* (2013.01); *H05K 1/0228* (2013.01)

(58) Field of Classification Search
CPC ............ H01R 12/7076; H01R 12/7082; H01R 12/7088; H01R 12/78; H01R 12/712; H01R 12/72; H05K 1/0228
(Continued)

(56) References Cited

U.S. PATENT DOCUMENTS

2012/0097857 A1* 4/2012 Hayatsu ............... H10F 39/804
250/366
2014/0027637 A1* 1/2014 Watano .............. G01T 1/20189
250/336.1

FOREIGN PATENT DOCUMENTS

JP 2006-112803 4/2006
JP 2010-101805 5/2010
(Continued)

OTHER PUBLICATIONS

Perez, et al., Laser Micromachining and Characterization of Metal-on-Glass High Density Pitch Adapters, 2015, Journal of Microelectromechanical Systems, 24. 1479-1486. 10.1109/JMEMS. 2015. (Year: 2015).*
(Continued)

*Primary Examiner* — Abdullah A Riyami
*Assistant Examiner* — Amara Anderson
(74) *Attorney, Agent, or Firm* — Knobbe, Martens, Olson & Bear, LLP

(57) ABSTRACT

A connector assembly is disclosed. The connector assembly can include first and second connectors. The first connector can include a first electronic component mounted on a first component mount region of the first substrate. The second connector can include a second electronic component mounted on a second component mount region of the second substrate. The first connector and the second connector have different profiles from each other as seen from a top plan view, and can have wider middle portions that overlap when assembled. The first connector can be configured to connect (Continued)

to a sensor panel and a first external substrate or component. The second connector can be configured to connect to the sensor panel and a second external substrate or component.

20 Claims, 6 Drawing Sheets

(51) Int. Cl.
*H01R 12/72* (2011.01)
*H05K 1/02* (2006.01)

(58) Field of Classification Search
USPC .......................................................... 439/65
See application file for complete search history.

(56) References Cited

FOREIGN PATENT DOCUMENTS

| | | | |
|----|------------|---|---------|
| JP | 2010-278220 | | 12/2010 |
| JP | 2017-053821 | | 3/2017 |
| JP | 2017053821 A | * | 3/2017 |

OTHER PUBLICATIONS

Extended European Search Report issued in European Patent Application No. 21850889.3 dated Jul. 3, 2024 in 10 pages.
International Report in International Application No. PCT/US2021/044009, dated Nov. 18, 2021.
Office Action dated Jan. 19, 2026 in Chinese Application No. 202180059121.1 in 26 pages.

* cited by examiner

CONNECTOR ASSEMBLY FOR SENSOR DEVICE

CROSS-REFERENCE TO RELATED APPLICATIONS

This application claims the benefit of U.S. Provisional Application No. 63/059,875 entitled "CONNECTOR ASSEMBLY FOR SENSOR DEVICE," filed Jul. 31, 2020, the entire disclosure of which is incorporated herein by reference for all purposes.

BACKGROUND

Field

The field relates to connector assemblies and, in particular, to connector assemblies for a sensor device.

Description of the Related Art

A sensor system (such as an X-ray sensor system) can include a sensor panel. For example, a digital X-ray panel can be connected to a circuit board by way of a connector. Input pins of the connector connect to pixels of the X-ray panel, and output pins of the connector connect to the circuit board. A pixel size on the digital X-ray panel is a key determinant of a pitch of the input pins that connect to conductive traces on the connector.

SUMMARY

In one aspect, a connector assembly is disclosed. The connector assembly can include a first connector that includes a first substrate having conductive traces that are formed on or in the first substrate. A first electronic component is mounted on a first component mount region of the first substrate. The conductive traces of the first connector include a plurality of first traces and a plurality of second traces. The first electronic component is positioned between the plurality of first traces and the plurality of second traces. The plurality of first traces are configured to connect to a sensor panel and the plurality of second traces are configured to connect to a first external substrate or component. The connector assembly also includes a second connector that includes a second substrate having conductive traces that are formed on or in the second substrate. A second electronic component is mounted on a second component mount region of the second substrate. The conductive traces of the second connector include a plurality of third traces and a plurality of fourth traces. The second electronic component is positioned between the plurality of third traces and the plurality of fourth traces. The plurality of third traces are configured to connect to the same sensor panel and the plurality of fourth traces are configured to connect to a second external substrate or component. The first connector and the second connector have different profiles from each other as seen from a top plan view.

In one embodiment, the first external substrate or component and the second external substrate or component are the same external substrate or component. The first and second external substrates or components can include a circuit board.

In one embodiment, the first substrate includes a first portion and a second portion of a single substrate. The first traces can be formed on or in the first portion and the second traces can be formed on or in the second portion.

In one embodiment, the first substrate includes a first portion and a second portion on separate substrates. The first traces can be formed on or in the first portion and the second traces can be formed on or in the second portion.

In one embodiment, the first substrate includes a first input pin region at ends of the first traces. A width of the first input pin region can be narrower than a width of the first component mount region.

In one embodiment, the first substrate and the second substrate include flexible substrates. A length of the second connector can be greater than a length of the first connector. A shape of the first substrate can differ from a shape of the second substrate. At least a portion of the first substrate can be narrower than a width of the first electronic component.

In one embodiment, a number of the plurality of first traces is greater than a number of the plurality of second traces, and a number of the plurality of third traces is greater than a number of the plurality of fourth traces. The number of the plurality of first traces can be the same as the number of the plurality of third traces.

In one embodiment, the first electronic component includes an integrated device die. The first electronic component can include a charge-to-digital convertor. The first and the second electronic components can include the same type of dies.

In one embodiment, the first traces has a pitch between adjacent traces of no more than about 60 microns.

In another aspect, a sensor system is disclosed. The sensor system includes a sensor panel, a circuit board that is coupled to the sensor panel, a first connector, and a second connector. The first connector includes a first substrate, a die mounted on a first die mount region of the first substrate, first input pins formed at a first input pin region of the first substrate and connected to the sensor panel, and first output pins formed at a first output pin region of the first substrate and connected to the circuit board. The first input pins and the first output pins are spaced apart long a length of the first substrate. A width of the first input pin region is narrower than a width of the first die mount region. The second connector includes a second substrate, a die mounted on a second die mount region of the second substrate, second input pins formed at a second input pin region of the second substrate and connected to the sensor panel, and second output pins formed at a second output pin region of the second substrate and connected to the circuit board. The second input pins and the second output pins are spaced apart along a length of the second substrate. A portion of the first die mount region overlaps a portion of the second die mount region.

In one embodiment, the first substrate and second substrate include flexible substrates. A length of the first connector can be greater than a length of the second connector. A shape of the first substrate can differ from a shape of the second substrate. A width of the second input pin region can be narrower than a width of the second die mount region.

In one embodiment, a number of the first input pins is greater than a number of the first output pins, and a number of the second input pins is greater than a number of the second output pins.

In one embodiment, a number of the first input pins is the same as a number of the second input pins.

In one embodiment, the first die includes a charge-to-digital convertor.

In one embodiment, the first and the second dies are same type of dies.

In one embodiment, the first input pins of the first connector and the second input pins of the second connector are positioned next to and in close proximity to each other. A spacing between a pin of the first input pins closest to the second input pins and a pin of the second input pins closest to the first input pins is in a range of 10 microns to 60 microns.

In one embodiment, the first input pins are spaced with a pitch of less than about 60 microns.

In one embodiment, a pitch of the first input pins and a pitch of the second input pins are generally the same. A spacing between a pin of the first input pins closest to the second input pins and a pin of the second input pins closest to the first input pins can be generally the same as the pitch of the first input pins such that each pin of the first and second input pins are equally spaced.

In one embodiment, at least a portion of the first connector overlaps with a portion of the second connector. At least a portion of the first die overlaps with a portion of the second die. The die mount region of the first connector and the die mount region of the second connector overlap. The sensor system can further include a spacer between the first die and the second die. The spacer can include a heatsink.

In another aspect, a sensor system is disclosed. The sensor system includes a sensor panel, a circuit board that is coupled to the sensor panel, a first flexible substrate, a first die, a second flexible substrate, and a second die. The first flexible substrate has first input pins at a first input pin region of the first flexible substrate that are connected to the sensor panel and first output pins disposed at a first output pin region of the first flexible substrate that are connected to the circuit board. The first flexible substrate has a first length. The first input pins and the first output pins are spaced along the first length of the first flexible substrate. The first die is mounted on a first die mount region of the first flexible substrate. The second flexible substrate has second input pins at a second input pin region of the first flexible substrate that are connected to the sensor panel and second output pins at a second output pin region of the first flexible substrate that are connected to the circuit board. The second flexible substrate has a second length. The second input pins and the second output pins are spaced along the second length of the second flexible substrate. The second length is greater than the first length. The second die is mounted on a second die mount region of the second flexible substrate.

In one embodiment, a width of the first input pin region is narrower than a width of the first die mount region.

In one embodiment, a shape of the first flexible substrate differs from a shape of the second flexible substrate. At least a portion of the first substrate can be narrower than a width of the first die.

In one embodiment, a number of the first input pins is greater than a number of the first output pins, and a number of the second input pins is greater than a number of the second output pins.

In one embodiment, a number of the first input pins is the same as a number of the second input pins.

In one embodiment, the first die includes a charge-to-digital convertor.

In one embodiment, the first and the second dies are identical dies.

In one embodiment, a spacing between a pin of the first input pins closest to the second input pins and a pin of the second input pins closest to the first input pins is in a range of 10 microns to 60 microns.

In one embodiment, the first input pins are spaced with a pitch of less than about 60 microns.

In one embodiment, the first input pins and the first die are connected through traces formed on or in the first flexible substrate.

In one embodiment, at least a portion of the first flexible substrate overlaps with a portion of the second flexible substrate. At least a portion of the first die can overlap with a portion of the second die.

In one embodiment, the first flexible substrate is bent such that a surface of the sensor panel and a surface of the first flexible substrate are non-parallel with each other. The sensor system can further include a spacer between the first die and the second die. The spacer can include a heatsink.

In another aspect, a connector assembly is disclosed. The connector assembly can include a first connector that includes a first substrate having conductive traces formed on or in the first substrate, and a first electronic component mounted on a first component mount region of the first substrate. The conductive traces of the first connector include a plurality of first input traces and a plurality of first output traces. The first electronic component is positioned between the plurality of first input traces and the plurality of first output traces. The first input traces are configured to connect to a sensor panel and the plurality of first output traces are configured to connect to a first external substrate or component. The connector assembly can include a second connector that includes a second substrate having conductive traces formed on or in the second substrate and a second electronic component mounted on a second component mount the second substrate. The conductive traces of the second connector include a plurality of second input traces and a plurality of second output traces. The second electronic component is positioned between the plurality of second input traces and the plurality of second output traces. The first input traces are configured to connect to the same sensor panel and the first output traces are configured to connect to a second external substrate or component. A length of the second connector is greater than a length of the first connector. The first substrate includes a first input pin region at ends of the first input traces. A width of the first input pin region is narrower than a width of the first component mount region.

In still another aspect, a sensor system is disclosed. The sensor system can include a sensor panel that has a connection edge, an active surface, and a back surface opposite the active surface. The second system can include a substrate or component that is vertically spaced from the back surface of the sensor panel along a first vertical direction transverse to the back surface. The sensor system can also include a first connector that includes a first substrate and a first die mounted on a first die mount region of the first substrate. The first substrate has a first input end portion that is connected to the connection edge of the sensor panel and a first output end portion that is connected to the substrate or component. The first input end portion and the first output end portion are spaced apart from each other long a length of the first substrate. The sensor system can include a second connector that includes a second substrate and a second die mounted on a second die mount region of the second substrate. The second substrate has a second input end portion that is connected to the connection edge of the sensor panel and a second output end portion that is connected to the substrate or component. The second input end portion and the second output end portion are spaced apart from each other along a length of the second substrate. The first die and the second die are laterally offset along a second lateral direction from each other. The second lateral direction is transverse to the first vertical direction and transverse to the connection edge of the sensor panel.

In one embodiment, the first substrate and second substrate include flexible substrates. The first and second flexible substrates can be bent about a third direction transverse to the first vertical direction and the second lateral direction. A length of the first connector can be greater than a length of the second connector. A shape of the first substrate can differ from a shape of the second substrate.

In one embodiment, the first die includes a charge-to-digital convertor.

In one embodiment, at least a portion of the first connector overlaps with a portion of the second connector along a third direction transverse to the first vertical direction and the second lateral direction. At least a portion of the first die can overlap with a portion of the second die along the third direction. The sensor system can further include a spacer between the first die and the second die. The spacer can include a heatsink.

BRIEF DESCRIPTION OF THE DRAWINGS

Embodiments of this disclosure will now be described, by way of non-limiting example, with reference to the accompanying drawings.

DETAILED DESCRIPTION

A sensor system such as an X-ray sensor system can include a sensor panel (e.g., a digital X-ray panel). The digital X-ray panel can include X-ray sensitive elements, which may comprise a plurality of pixels, that can convert incident X-ray radiation into an electric charge. The electric charge from the sensor panel can be transferred to a circuit board through a connector, which can convert the collected charge to a digital signal. The connector includes input pins that connect to the pixels of the X-ray panel, and output pins that connect to the circuit board. The connector can also include a converter (e.g., a charge-to-digital converter) that is positioned between the output pins and the input pins, and can convert the electric charge into a digital signal. A pitch of the input pins can be determined by a pixel size of each pixel in the sensor panel.

Figures 1, 2:
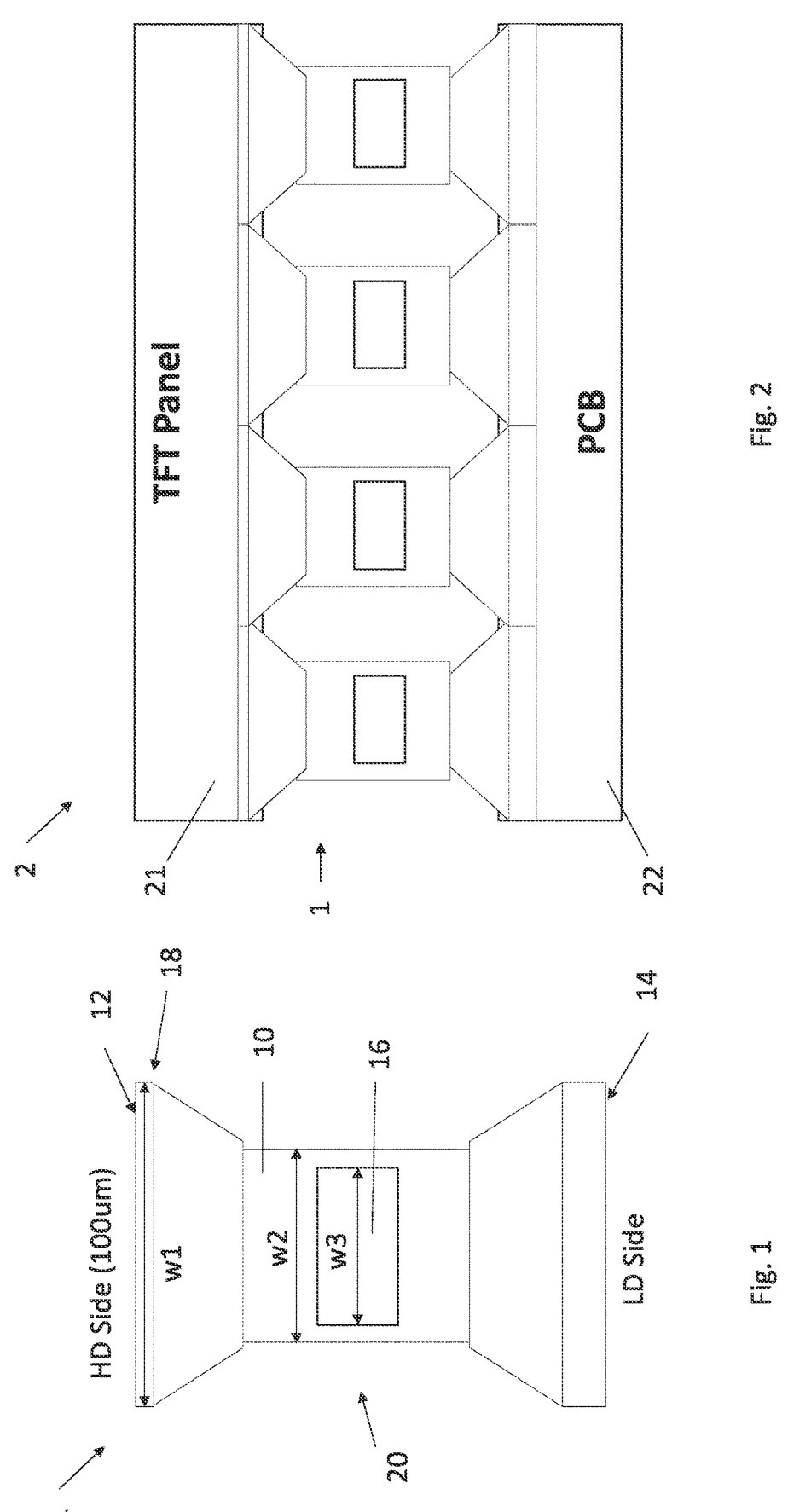
FIG. 1 is a schematic top plan view of a connector.
FIG. 2 is a schematic plan view of a sensor system.

FIG. 1 is a schematic top plan view of a connector 1. The connector 1 can comprise a substrate 10 (e.g., a flexible substrate), input pins 12, output pins 14, and a die 16 mounted on the substrate 10. The connector 1 can also include conductive traces (not illustrated) that electrically connect the input pins 12, the output pins 14, and the die 16. In some applications, a number of input pins 12 can be greater than a number of the output pins 14. The input pins 12 have a pitch, including pin width and spacing between adjacent pins. In the illustrated example, the pitch is set to about 100 microns. In such a configuration, a width w1 of the connector 1 at an input pin region 18 can be greater than a width w2 of the connector at a die mount region 20 or a width w3 of the die 16. It will be understood that, when the width w3 of the die 16 is wider, the width w1 of the connector 1 at the input pin region 18 can be as wide as or narrower than the width w3 of the die 16.

FIG. 2 is a schematic plan view of a sensor system 2. The sensor system 2 illustrated in FIG. 2 includes four connectors 1, each of which can have the same features as the connector of FIG. 1. The input pins 12 of the connectors 1 are connected to a sensor panel 21 (e.g., a thin film transistor (TFT) panel) and the output pins 14 of the connectors 1 are connected to a circuit board 22 (e.g., a printed circuit board (PCB)). A field-programmable gate array (not illustrated) can be provided with the circuit board 22, which can control and/or read the die 16. The die 16 can comprise a charge-to-digital converter. In order to reduce sizing of the sensor system 2, it would be preferable to connect each connector 1 close to each other. Therefore, the input pins 12 of the connectors are closely aligned without a gap or with a relatively small gap. For example, a side of the sensor panel 21 can be completely filled with pixels (not illustrated) without a dead space or area and the input pins 12 can be connected to the pixels.

In some applications, such as in digital X-ray applications including mammography, high resolution (e.g., smaller pixels) may be necessary, and smaller pitches for the input pins 12 can be required. For example, in such applications, it may be preferred to have the pitch of the input pins 12 less than 100 microns, about 60 microns, or less than about 60 microns.

Figures 3, 4:
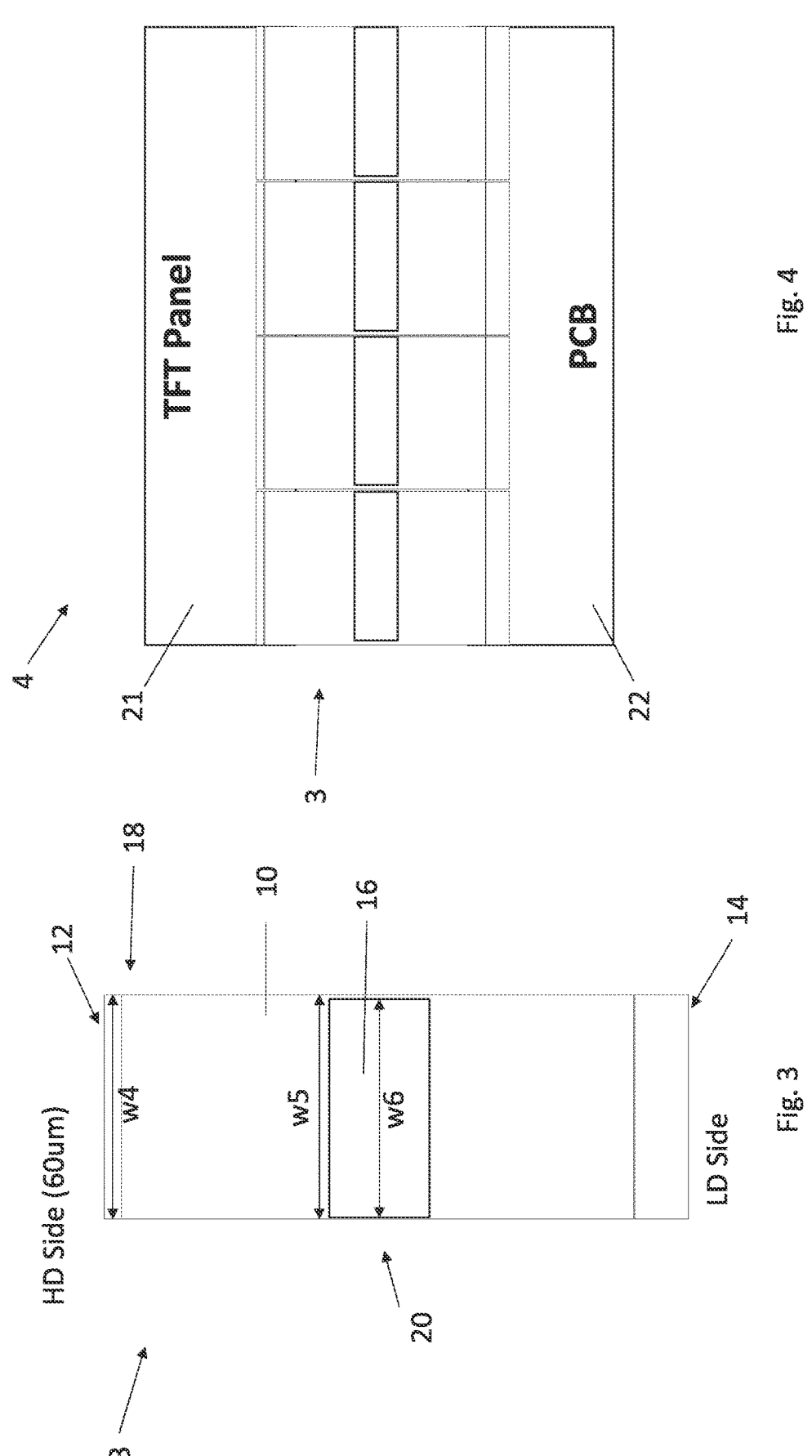
FIG. 3 is a schematic top plan view of another connector.
FIG. 4 is a schematic plan view of a sensor system that includes four connectors of FIG. 3.

FIG. 3 is a schematic top plan view of a connector 3. The connector 3 can comprise a substrate 10 (e.g., a flexible substrate), input pins 12, output pins 14, and a die 16 mounted on the substrate 10. FIG. 4 is a schematic plan view of a sensor system 4 that includes four such connectors 3, each of which can have the same features as the connector 3 of FIG. 3. The connector 3 is generally similar to the connector 1 illustrated in FIGS. 1-2 except that the pitch of the input pins 12 of the connector 3 is set to about 60 microns. In such a configuration, a width w4 of the connector 1 at an input pin region 18 can be generally similar to a width w5 of the connector at a die mount region 20 or a width w6 of the die 16. It will be understood that, when the width w6 of the die 16 is wider, the width w4 of the connector 1 at the input pin region 18 can be narrower than the width w3 of the die 16.

Figure 5B:
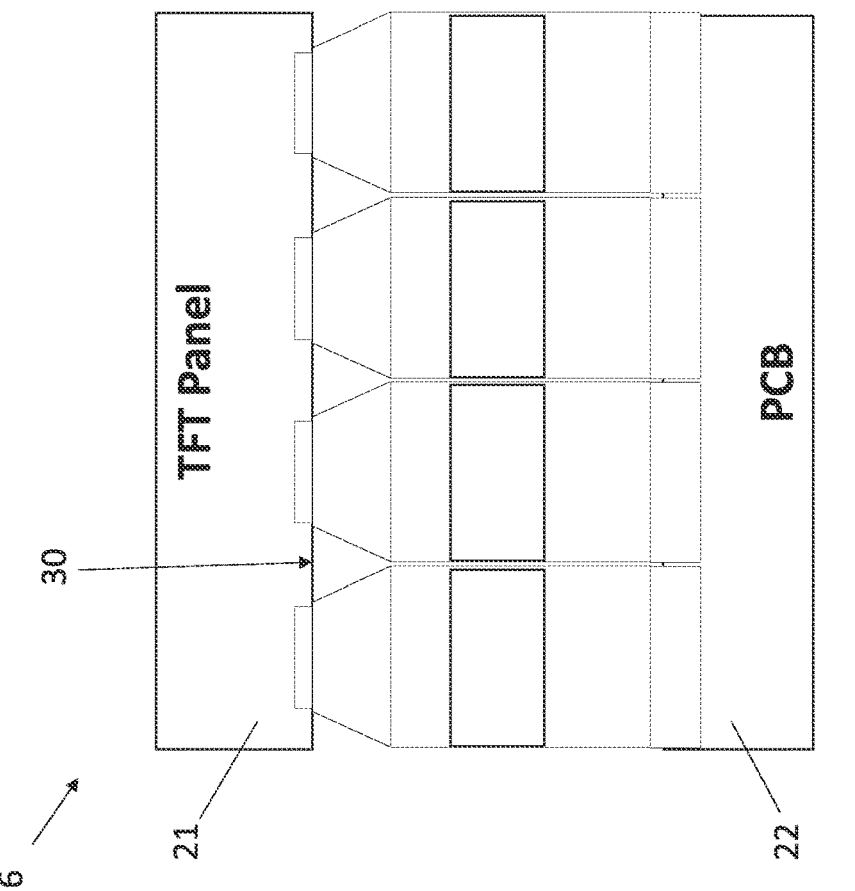
FIG. 5B is a schematic plan view of a sensor system that includes four connectors of FIG. 5A.
Figure 5A:
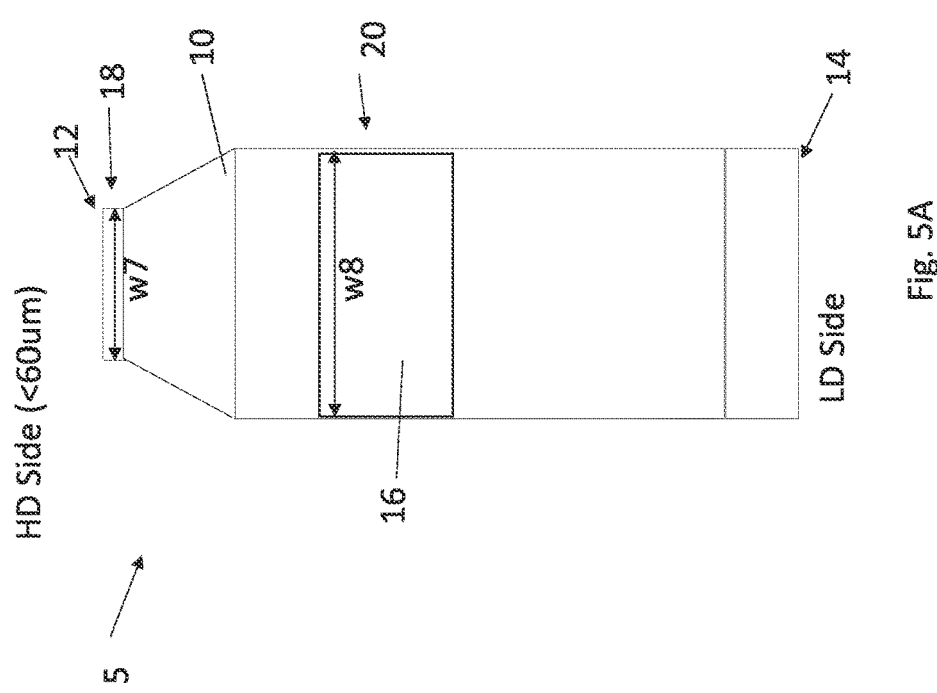
FIG. 5A is a schematic top plan view of another connector.

FIG. 5A is a schematic top plan view of a connector 5. FIG. 5B is a schematic plan view of a sensor system 6 that includes four such connectors 5, each of which can include the features of the connector of FIG. 5A. The connector 5 is generally similar to the connector 1 illustrated in FIGS. 1-2 and the connector 3 illustrated in FIGS. 3-4 except that the pitch of the input pins 12 of the connector 5 is less than 60 microns. In such a configuration, a width w4 of the connector 5 at an input pin region 18 can be narrower than a width w8 of the die 16. In other words, the width w8 of the die 16, or the width of the substrate 10 at the die 16, can define the widest width of the connector 5. Therefore, the sensor system 6 with the connectors 5 can have dead areas 30 between adjacent connectors 5 at a side of the sensor panel 21 that receives the connectors.

Figure 6:
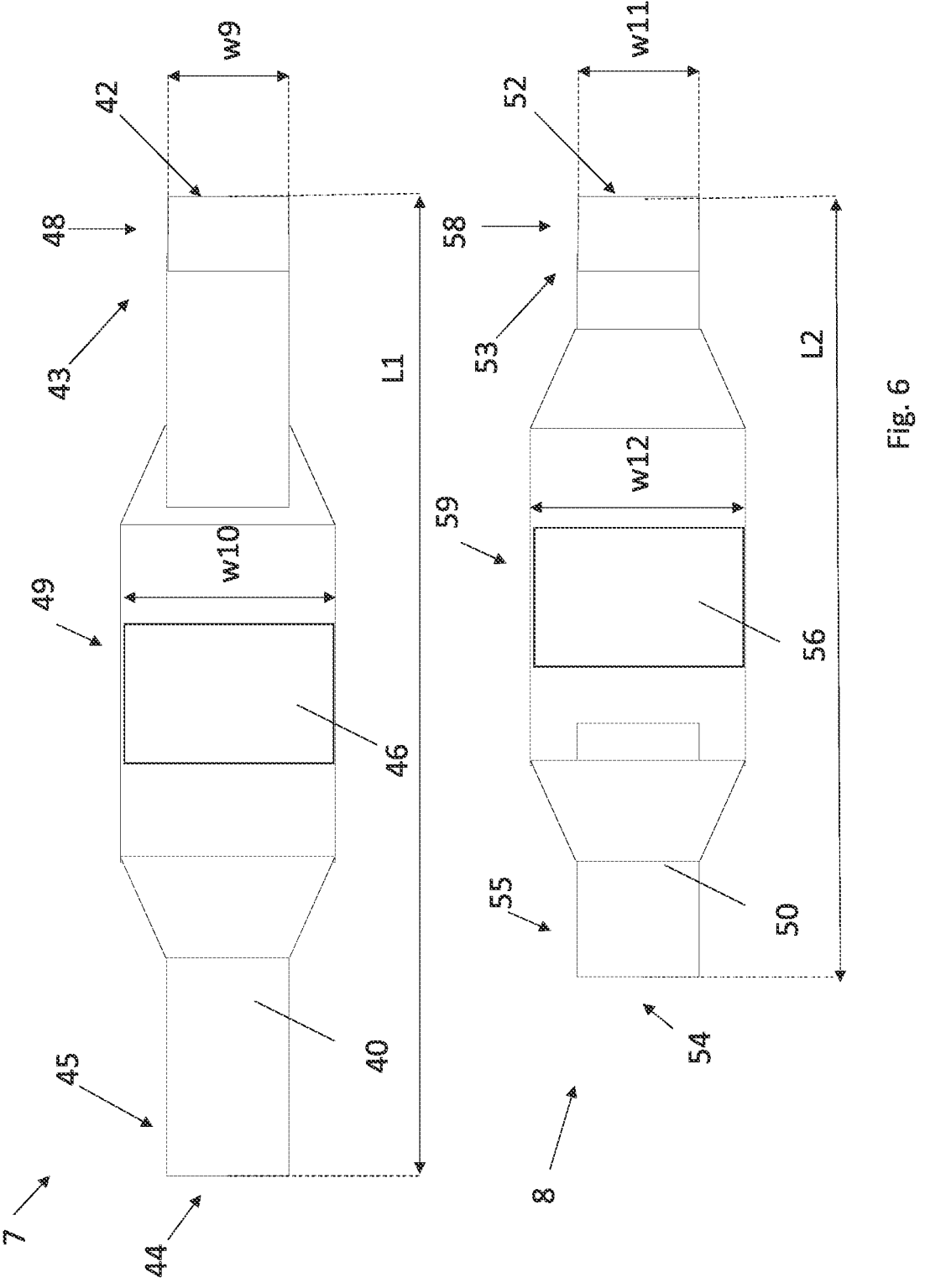
FIG. 6 is a schematic top plan view of a set of connectors according to an embodiment.

FIG. 6 is a schematic top plan view of a set of connectors (a first connector 7 and a second connector 8) according to an embodiment. The first connector 7 and the second connector 8 can have different profiles from each other as seen from the top plan view, and in the illustrated embodiment have different lengths. The first connector 7 can comprise a first substrate 40 (e.g., a flexible substrate), pins (e.g., first input pins 42 and first output pins 44), and a first die 46 mounted on a die mount region 49 of the first substrate 40. The first connector 7 can also include first conductive traces (not illustrated) formed on or in a first portion of the first substrate 40 that electrically connects the first input pins 42 and the first die 46, and second conductive traces (not illustrated) formed on or in a second portion of the first substrate 40 that electrically connects the first output pins 44 and the first die 46. In some embodiments, the first substrate 40 can comprise a single substrate that includes the first portion and the second portion. In some other embodiments, the first substrate 40 can comprise two or more separate portions (e.g., physically separated substrates). For example, the first portion of the first substrate 40 can be connected to the first die 46, and the second portion of the first substrate 40 that is separate from the first portion can be connected to the first die 46. In some applications, a number of first input pins 42 can be greater than a number of first output pins 44.

The second connector 8 can comprise a second substrate 50 (e.g., a flexible substrate), pins (e.g., second input pins 52 and second output pins 54), and a second die 56 mounted on a die mount region 59 of the second substrate 50. The second connector 8 can also include conductive traces (not illustrated) formed on or in a first portion of the second substrate 50 that electrically connects the second input pins 52, and the second die 56, and second conductive traces (not illustrated) formed on or in a second portion of the second substrate 50 that electrically connects the second output pins 54 and the second die 56. In some embodiments, the second substrate 50 can comprise a single substrate that includes the first portion and the second portion. In some other embodiments, the second substrate 50 can comprise two or more separate portions (e.g., physically separated substrates). For example, the first portion of the second substrate 50 can be connected to the second die 56, and the second portion of the second substrate 50 that is separate from the first portion can be connected to the second die 56. In some applications, a number of second input pins 52 can be greater than a number of the second output pins 54.

The first substrate 40 and the second substrate 50 can comprise any suitable substrate. For example, the first substrate 40 and/or the second substrate 50 can comprise a flexible substrate. The flexible substrate can include a nonconductive material and the conductive traces formed on or in the nonconductive material. The flexible substrate can be sufficiently flexible to bend in a plurality of directions. The flexible substrate can be flexible during manufacture and in a final product.

In some embodiments, the number of the first input pins 42 and the number of the second input pins 52 can be the same. In some other embodiments, the number of the first input pins 42 and the number of the second input pins 52 can be different. The first input pins 42 have a pitch characterized by pin widths and spacings between adjacent pins. Similarly, the second input pins 52 have a pitch characterized by pin widths and spacings between adjacent pins. In some embodiments, the first input pins 42 and the second input pins 52 can have the same pitch. In some embodiments, the pitch of the first input pins 42 and/or the second input pins 52 can be less than about 60 microns. For example, the pitch of the first input pins 42 and/or the second input pins 52 can be about 40 microns to about 60 microns, about 50 microns to about 60 microns, or about 40 microns to about 50 microns. In some embodiments, a width w10 of the die 46 can be greater than a width w9 of the connector 7 at an input pin region 48, and a width w12 of the die 56 can be greater than a width w11 of the connector 8 at an input pin region 58. A skilled artisan will understand that when the width w10 of the die 46 is wider, the width w9 of the connector 7 at the input pin region 48 with a pitch more than 60 microns may still be narrower than the width w10 of the die 46. Similarly, when the width w12 of the die 56 is wider, the width w11 of the connector 8 at the input pin region 58 with a pitch more than 60 microns may still be narrower than the width w12 of the die 56.

The width w9 of the connector 7 at the input pin region 48 and the width w11 of the connector 8 at the input pin region 58 can depend at least in part on a number of the pins 42, 52 and the pitch of the input pins 42, 52. In some embodiments, the width w9 and the width w11 can roughly be the product of the number of the first input pins 42 and the pitch of the first input pins 42 and the product of the number of the second input pins 52 and the pitch of the second input pins 52, respectively. In some embodiments, the connector 7, 8 can comprise, for example, about 270 input pins 42, 52. For example, when the pitch is set to about 60 microns, the width w9 of the connector 7 at the input pin region 48 and the width w11 of the connector 8 can be in a range of about 1.6 cm to about 1.7 cm, or in a range of about 1.614 cm to about 1.73 cm. However, as the pitch and the number of pins vary, the width w9 of the connector 7 at the input pin region 48 and the width w11 of the connector 8 at the input pin region 58 vary accordingly. For another example, when the pitch is set to about 30 microns, the width w9 of the connector 7 at the input pin region 48 and the width w11 of the connector 8 can be in a range of about 0.8 cm to about 0.85 cm, or in a range of about 0.807 cm to about 0.865 cm. For another example, when the pitch is set to about 10 microns, the width w9 of the connector 7 at the input pin region 48 and the width w11 of the connector 8 can be in a range of about 0.42 cm to about 0.29 cm, or in a range of about 0.269 cm to about 0.288 cm.

The die 46, 56 can comprise any suitable die. In some embodiments, the die 46, 56 can comprise a charge-to-digital converter. For example, the charge-to-digital converter can comprise ADAS1256 manufactured by Analog Devices, Inc., of Norwood, MA, or a converter that has the same or similar functions as ADAS1256. The first input pins 42 can be coupled with input terminals of the die 46 through the conductive traces formed on or in the first substrate 40. Similarly, the second input pins 52 can be coupled with input terminals of the die 56 through the conductive traces formed on or in the second substrate 50. The first output pins 44 can be coupled with output terminals of the die 46 through the conductive traces formed on or in the first substrate 40. Similarly, the second output pins 54 can be coupled with output terminals of the die 56 through the conductive traces formed on or in the second substrate 50. In some embodiments, the width w10 of the die 46 and the width w12 of the die 56 can be in a range of about 1 cm to about 2 cm. For example, the width w10 and/or the width w12 can be in a range of about 1 cm to about 1.5 cm, in a range of about 1 cm to about 1.35 cm, in a range of about 1.2 cm to about 1.7 cm, in a range of about 1.3 cm to about 1.5 cm, or about 1.35 cm.

The first connector 7 has a length L1 and the second connector 8 has a length L2. In some embodiments, the length L1 of the first connector 7 can be greater than the length L2 of the second connector 8. In some embodiments, a difference between the length L1 of the first connector 7 the length L2 of the second connector 8 (L1-L2) can be at least twice a thickness t1 (see FIG. 7B) of the die 56 plus a thickness of the second substrate 50. In some embodiments, the difference (L1-L2) can be at least about 750 microns. In some embodiments, the difference (L1-L2) can be less than 100 cm. For example, the difference (L1-L2) can be in a range of, 750 microns to 10 cm, in a range of 750 microns to 1 cm, or in a range from 750 microns to 1 mm.

Figure 7B:
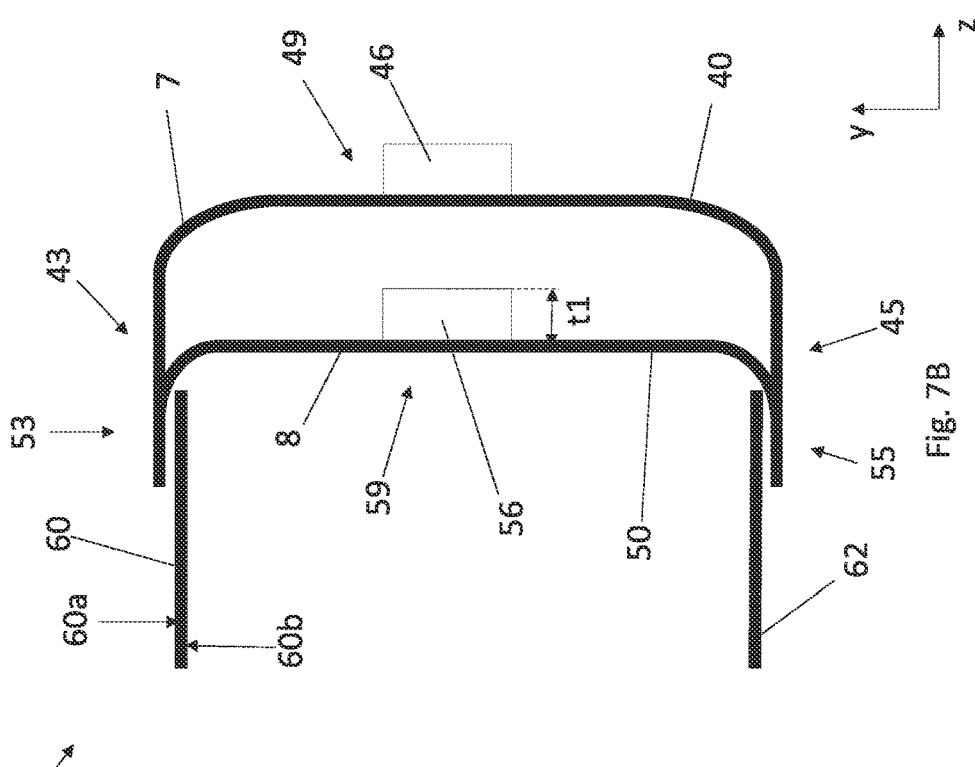
FIG. 7B is a schematic side view of the sensor system as seen from a 90° angle relative to FIG. 7A.
Figure 7A:
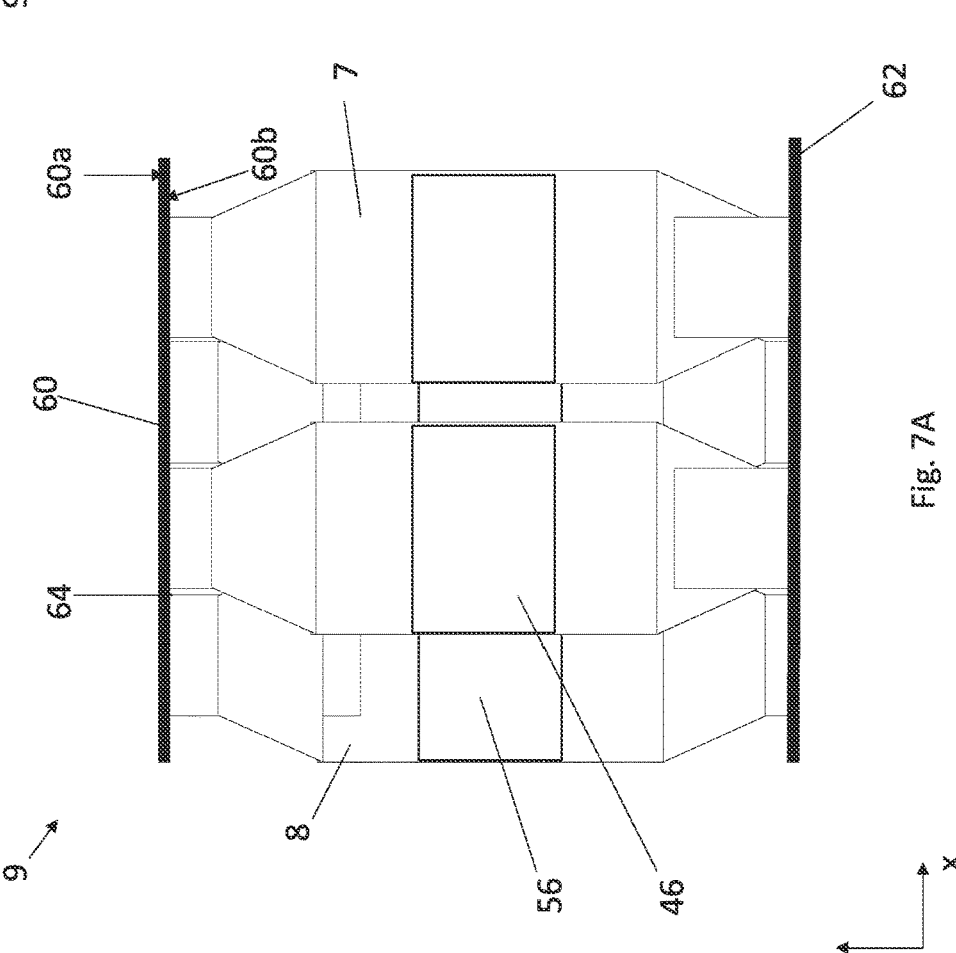
FIG. 7A is a schematic side view of a sensor system according to an embodiment, showing an optical sensor at a top end and a circuit board at a bottom end.

FIG. 7A is a schematic side view of a sensor system 9 according to an embodiment. FIG. 7B is a schematic side view of the sensor system 9 as seen from a 90° angle relative to FIG. 7A. The sensor system 9 can include the first and second connectors 7, 8 illustrated in FIG. 6. The illustrated sensor system 9 includes two pairs of the set of connecters 7, 8. The sensor system 9 can include a sensor panel 60, which can be an optical and more particularly X-ray sensor, and an external substrate or component (e.g., a circuit board 62) that are coupled by way of the connectors 7, 8. The sensor panel 60 has an active surface 60a and a back surface 60b. The circuit board 62 is vertically spaced from the back surface 60b of the sensor panel 60 along a vertical direction (along a y-axis in FIGS. 7A and 7B) transverse to the back surface that extends generally along an x-axis. Although the connectors 7, 8 are connected to the same circuit board 62 in the illustrated embodiment, the connectors 7, 8 can be connected to different external substrates or components, in some embodiments.

Referring to FIGS. 6-7B, the first substrate 40 can have a first input end portion 43 (e.g., the first input pin region 48) connected to the sensor panel 60, and a first output end portion 45 connected to the circuit board 62. The first input end portion 43 and the first output end portion 45 can be spaced apart from each other long the length L1 (vertical in FIGS. 7A-7B along the y-axis) of the first substrate 40. The second substrate 50 can have a second input end portion 53 (e.g., the second input pin region 58) connected to the sensor panel 60 and a second output end portion 55 connected to the circuit board 62. The second input end portion 53 and the second output end portion 55 can be spaced apart from each other along the length L2 (vertical in FIGS. 7A-7B along the y-axis) of the second substrate 50. The first die 46 and the second die 56 can be laterally offset along a second lateral direction (along the x-axis) from each other, as shown in FIG. 7A. The second lateral direction (x-axis) is transverse to the first vertical direction (y-axis). The first die 46 and the second die 56 can be spaced apart along a direction in a z-axis, as shown in FIG. 7B.

In some embodiments, the first input portion 43 and the first output portion 45 of the first substrate 40 can bend relative to the mount region 49, and the second input portion 53 and the second output portion 55 of the second substrate 50 can bend relative to the mount region 59. In some embodiments, at least a portion of the first connector 7 overlaps with a portion of the second connector 8 along the direction in the z-axis transverse to the first vertical direction in the y-axis and the second lateral direction in the x-axis.

In the sensor system 9 that utilizes the first and second connectors 7, 8, the input pins 42, 52 can be connected to the sensor panel 60 with a minimum or without any dead space on a side of the sensor panel. For example, the sensor system 9 that includes the first and second connectors 7, 8 can eliminate or reduce the dead area 30 (see FIG. 5B) that is present in the sensor system 6 that does not include the first and second connectors 7, 8. In some embodiments, a spacing 64 (FIG. 7A) between a pin of the first input pins 42 closest to the second input pins 52 and a pin of the second input pins 52 closest to the first input pins 42 can be in a range of 10 microns to 100 microns. For example, the spacing 64 can be in a range of 10 microns to 80 microns, in a range of 10 microns to 60 microns, in a range of 10 microns to 40 microns, in a range of 30 microns to 80 microns, or in a range of 30 microns to 60 microns. In some embodiments, the spacing 64 can be generally similar to the pitch of the first input pins 42 and/or the pitch of the second input pins 52.

Accordingly, a system with the set of connectors 7, 8 can be particularly beneficial when the width w10 of the die 46 is greater than the width w9 of the connector 7 at the input pin region 48, and/or the width w12 of the die 56 is greater than the width w11 of the connector 8 at the input pin region 58. In some embodiments, the system with the set of connectors 7, 8 can be particularly beneficial when the width w10 of the die 46 is greater than the product of the number of the first input pins 42 and the pitch of the first input pins 42, and/or the width w12 of the die 56 is greater than the product of the number of second input pins 52 and the pitch of the second input pins 52.

Figure 8B:
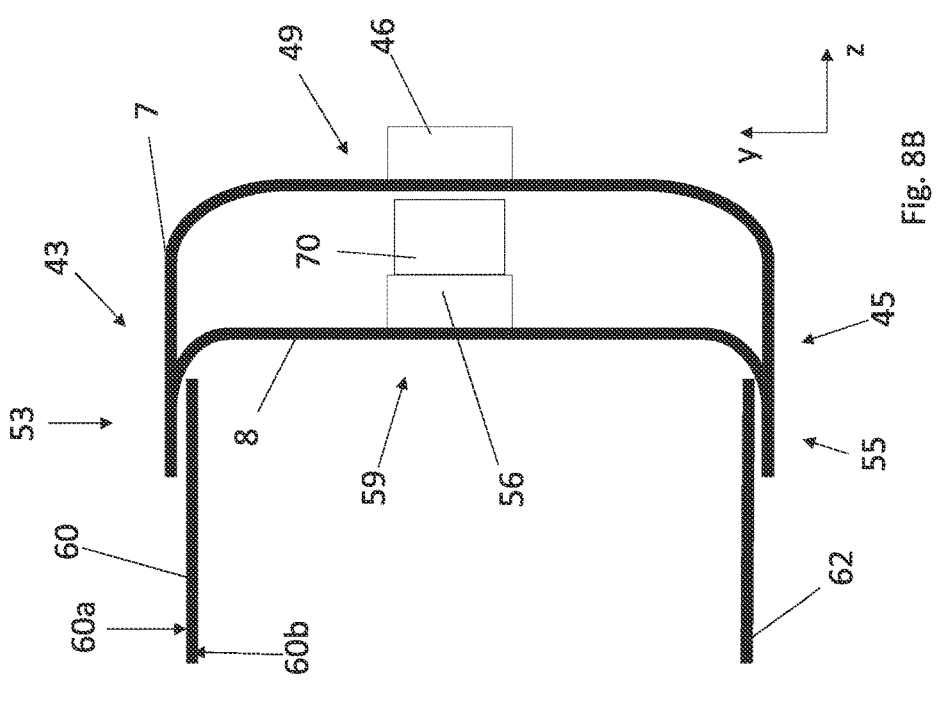
FIG. 8B is a schematic side view of the sensor system as seen from a 90° angle relative to FIG. 8A.
Figure 8A:
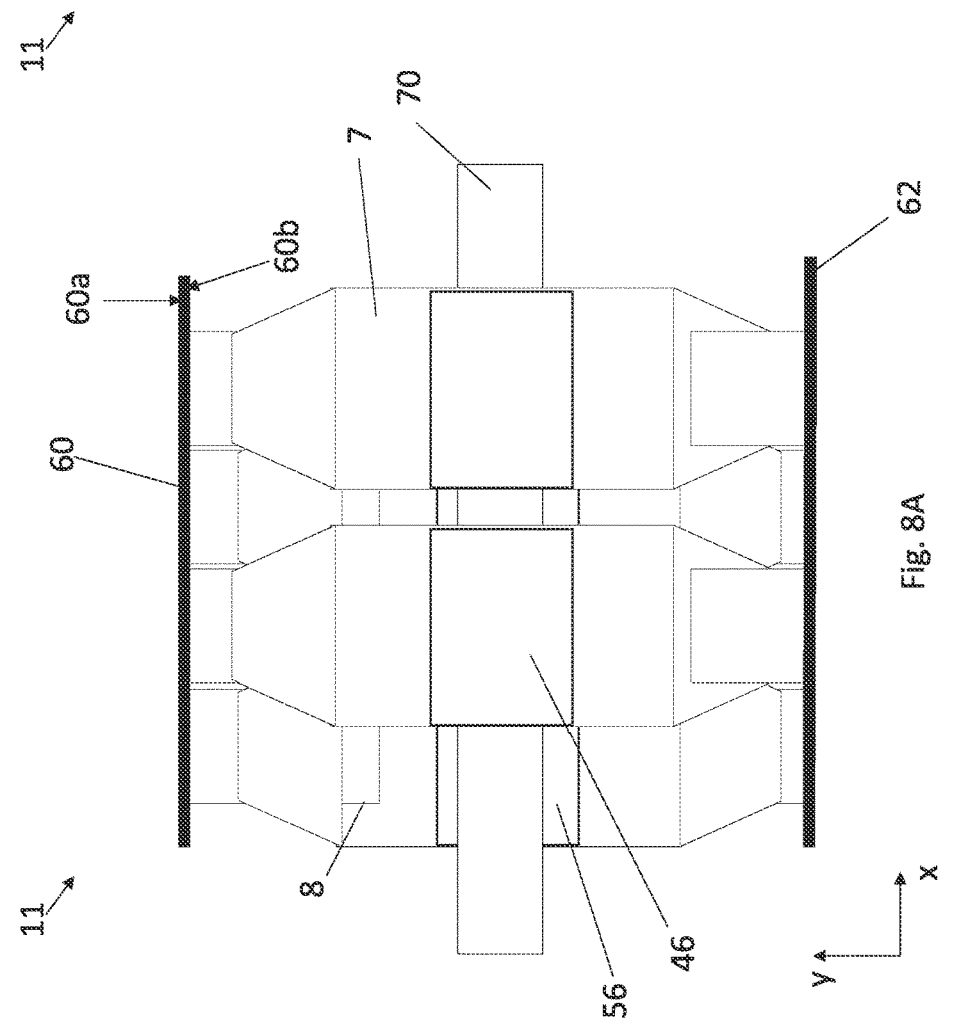
FIG. 8A is a schematic side view of a sensor system according to another embodiment.

FIG. 8A is a schematic side view of a sensor system 11 according to an embodiment. FIG. 8B is a schematic side view of the sensor system 11 as seen from a 90° angle relative to FIG. 8A. The sensor system 11 is generally similar to the sensor system 9 illustrated in FIGS. 7A and 7B except that the sensor system 11 includes a spacer 70 between the first connector 7 and the second connector 8. In some embodiments, the spacer 70 can be positioned between the first die 46 and the second die 56. The spacer can comprise any suitable conductive or nonconductive material. In some embodiments, the spacer 70 comprises a heatsink. In some embodiments, the spacer 70 can be grounded.

Although disclosed in the context of certain embodiments and examples, it will be understood by those skilled in the art that the present invention extends beyond the specifically disclosed embodiments to other alternative embodiments and/or uses and obvious modifications and equivalents thereof. In addition, while several variations have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

Moreover, language such as "up to," "at least," "greater than," "less than," "between," and the like includes the number recited. Numbers preceded by a term such as "approximately", "about", and "substantially" as used herein include the recited numbers (e.g., about 10%=10%), and also represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

What is claimed is:

1. A connector assembly comprising:
a first connector including a first substrate having conductive traces formed on or in the first substrate and a first electronic component mounted on a first component mount region of the first substrate, the conductive traces of the first connector comprising:
a plurality of first traces and a plurality of second traces, the first electronic component positioned between the plurality of first traces and the plurality of second traces, the plurality of first traces configured to connect to a sensor panel and the plurality of second traces configured to connect to a first external substrate or component; and
a second connector including a second substrate having conductive traces formed on or in the second substrate and a second electronic component mounted on a second component mount region of the second substrate, the conductive traces of the second connector comprising:
a plurality of third traces and a plurality of fourth traces, the second electronic component positioned between the plurality of third traces and the plurality of fourth traces, the plurality of third traces configured to connect to the same sensor panel and the plurality of fourth traces configured to connect to a second external substrate or component,
wherein the first connector and the second connector have different profiles from each other as seen from a top plan view,
wherein the plurality of first traces and the plurality of third traces are configured to connect to adjacent portions of the sensor panel.

2. The connector assembly of claim 1, wherein the first external substrate or component and the second external substrate or component are the same external substrate or component.

3. The connector assembly of claim 2, wherein the first and second external substrates or components comprise a circuit board.

4. The connector assembly of claim 1, wherein the first substrate comprises a first portion and a second portion of a single substrate, the first traces are formed on or in the first portion and the second traces are formed on or in the second portion.

5. The connector assembly of claim 1, wherein the first substrate comprises a first portion and a second portion on separate substrates, the first traces are formed on or in the first portion and the second traces are formed on or in the second portion.

6. The connector assembly of claim 1, wherein the first substrate and the second substrate comprise flexible substrates.

7. The connector assembly of claim 6, wherein the flexible substrates are arranged such that a contour length of the second connector is greater than a contour length of the first connector, while a height of the second connector is equal to a height of the first connector.

8. The connector assembly of claim 6, wherein at least a portion of the first substrate is narrower than a width of the first electronic component.

9. The connector assembly of claim 1, wherein the first electronic component comprises a charge-to-digital convertor.

10. The connector assembly of claim 1, wherein the first traces have a pitch between adjacent traces of no more than about 60 microns.

11. A sensor system comprising:
a sensor panel;
a circuit board coupled to the sensor panel;
a first connector including a first substrate, a die mounted on a first die mount region of the first substrate, first input pins formed at a first input pin region of the first substrate and connected to the sensor panel, and first output pins formed at a first output pin region of the first substrate and connected to the circuit board, the first input pins and the first output pins spaced apart along a length of the first substrate, a width of the first input pin region being narrower than a width of the first die mount region; and
a second connector including a second substrate, a die mounted on a second die mount region of the second substrate, second input pins formed at a second input pin region of the second substrate and connected to the sensor panel, and second output pins formed at a second output pin region of the second substrate and connected to the circuit board, the second input pins and the second output pins spaced apart along a length of the second substrate, a portion of the first die mount region overlapping a portion of the second die mount region,
wherein the first input pins of the first connector and the second input pins of the second connector are positioned adjacent to each other.

12. The sensor system of claim 11, wherein the first substrate and second substrate comprise flexible substrates.

13. The sensor system of claim 12, wherein a length of the first connector is greater than a length of the second connector.

14. The sensor system of claim 12, wherein a width of the second input pin region being narrower than a width of the second die mount region such that, when projected along a same direction where the portion of the first die mount region and the portion of the second die mount region overlaps, the first input pin region and the second input pin region do not overlap.

15. The sensor system of claim 11, wherein the first input pins of the first connector and the second input pins of the second connector are positioned next to and in close proximity to each other, a spacing between a pin of the first input pins closest to the second input pins and a pin of the second input pins closest to the first input pins is in a range of 10 microns to 60 microns.

16. The sensor system of claim 11, further comprises a spacer between the first connector and the second connector.

17. A connector assembly comprising:
a first connector including a first substrate having conductive traces formed on or in the first substrate and a first electronic component mounted on a first component mount region of the first substrate, the conductive traces of the first connector comprising:
a plurality of first input traces and a plurality of first output traces, the first electronic component positioned between the plurality of first input traces and the plurality of first output traces, the plurality of first input traces configured to connect to a sensor panel and the plurality of first output traces configured to connect to a first external substrate or component; and a second connector including a second substrate having conductive traces formed on or in the second substrate and a second electronic component mounted on a second component mount region of the second substrate, the conductive traces of the second connector comprising:

a plurality of second input traces and a plurality of second output traces, the second electronic component positioned between the plurality of second input traces and the plurality of second output traces, the plurality of second input traces configured to connect to the same sensor panel and the plurality of second output traces configured to connect to a second external substrate or component, wherein a length of the second connector is greater than a length of the first connector, the first substrate includes a first input pin region at ends of the first input traces, a width of the first input pin region being narrower than a width of the first component mount region, and wherein the plurality of first input traces and the plurality of second input traces are configured to connect to adjacent portions of the sensor panel.

18. The connector assembly of claim 17, wherein the first substrate and the second substrate comprise flexible substrates.

19. The connector assembly of claim 17, wherein the first electronic component comprises a charge-to-digital convertor.

20. The connector assembly of claim 17, wherein the first traces have a pitch between adjacent traces of no more than about 60 microns.

\* \* \* \* \*